United States Patent
Pump et al.

(10) Patent No.: US 11,737,225 B2
(45) Date of Patent: Aug. 22, 2023

(54) DEVICE

(71) Applicant: Vitesco Technologies GmbH, Regensburg (DE)

(72) Inventors: Christian Pump, Munich (DE); Detlev Bagung, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 0 days.

(21) Appl. No.: 17/840,808

(22) Filed: Jun. 15, 2022

(65) Prior Publication Data
US 2022/0400567 A1 Dec. 15, 2022

(30) Foreign Application Priority Data
Jun. 15, 2021 (DE) ...................... 10 2021 206 103.6

(51) Int. Cl.
*H05K 9/00* (2006.01)
*H05K 5/02* (2006.01)
*H05K 5/00* (2006.01)

(52) U.S. Cl.
CPC ......... *H05K 5/0247* (2013.01); *H05K 5/0047* (2013.01); *H05K 9/0033* (2013.01); *H05K 9/0037* (2013.01)

(58) Field of Classification Search
CPC ........................... H05K 9/0033; H05K 9/0037
See application file for complete search history.

(56) References Cited

U.S. PATENT DOCUMENTS

| | | | |
|---|---|---|---|
| 5,414,597 A | 5/1995 | Lindland et al. | |
| 5,504,659 A | 4/1996 | Acatay et al. | |
| 5,566,040 A * | 10/1996 | Cosquer | H05K 9/0037 361/107 |
| 6,683,245 B1 * | 1/2004 | Ogawa | H05K 9/0037 174/382 |

(Continued)

FOREIGN PATENT DOCUMENTS

| | | |
|---|---|---|
| DE | 4407492 A1 | 9/1995 |
| DE | 69504232 T2 | 1/1999 |

(Continued)

*Primary Examiner* — Hung V Ngo
(74) *Attorney, Agent, or Firm* — Laurence A. Greenberg; Werner H. Stemer; Ralph E. Locher

(57) ABSTRACT

A housing has electrically conductive top and bottom parts which together form an accommodation chamber. A circuit board is arranged in the accommodation chamber. A bottom side of the circuit board is connected electrically to the top side via conductive bores. The circuit board has circuit components and electromechanical plug components for connecting to components outside the housing. A first electrically conductive separating wall electrically connects the housing top part to the top side of the circuit board. A second electrically conductive separating wall electrically connects the housing bottom part to the bottom side of the circuit board. The first and second separating walls subdivide the accommodation chamber into first and second accommodation-chamber sections that are disposed on opposite sides of the first and second separating walls. The circuit components are accommodated only in the first accommodation-chamber section and the plug components are accommodated only in the second accommodation-chamber section.

6 Claims, 2 Drawing Sheets

(56) References Cited

U.S. PATENT DOCUMENTS

| | | | |
|---|---|---|---|
| 7,269,033 B2* | 9/2007 | Berberich | H01R 13/6658 361/818 |
| 2015/0009642 A1* | 1/2015 | Caclard | H05K 9/0039 174/541 |
| 2017/0127580 A1* | 5/2017 | Testin | H05K 3/3415 |
| 2021/0307219 A1* | 9/2021 | Mantis | H05K 9/0039 |

FOREIGN PATENT DOCUMENTS

| | | |
|---|---|---|
| DE | 102020107131 A1 | 9/2021 |
| JP | 2529605 Y2 | 3/1997 |

* cited by examiner

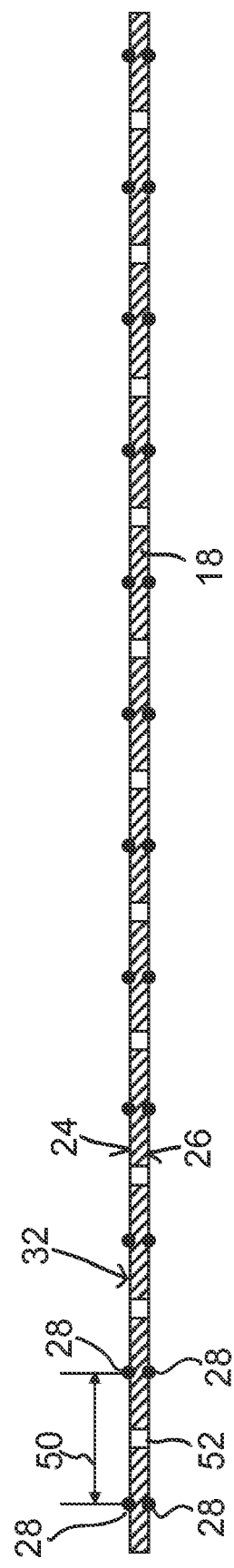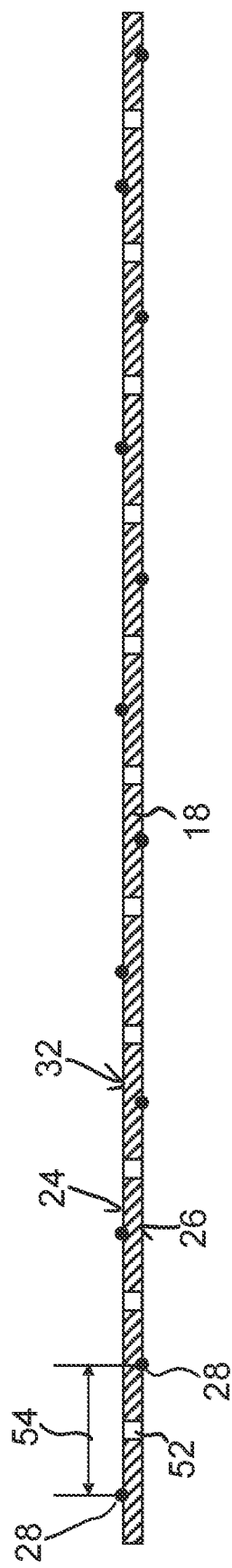

DEVICE

CROSS-REFERENCE TO RELATED APPLICATION

This application claims the priority, under 35 U.S.C. § 119, of German Patent Application DE 10 2021 206 103.6, filed Jun. 15, 2021; the prior application is herewith incorporated by reference in its entirety.

FIELD AND BACKGROUND OF THE INVENTION

The present invention relates to a device.

Devices such as, for example, control units are often tested with regard to their electromagnetic compatibility. Here, the question is whether the electromagnetic radiation generated by the electrical and electronic components of the device could possibly interfere with other units in the surroundings of the device. The aim is for only a limited amount of electromagnetic radiation to emerge from the device. This is because transmission of too much electromagnetic radiation by the device into its surroundings can result in neighboring units being interfered with.

In order to dampen transmission of the electromagnetic radiation into the surroundings of the device, devices are commonly provided with a metallic housing. In this case, the metallic housing acts like a Faraday cage which shields the radiation generated in the interior of the housing with respect to outward transmission.

Such devices, however, commonly have a plug-connector section. The plug-connector section serves for electrical connection of the device to other components outside the device. In order to allow an electrical connection to the surroundings, it is often the case that a part of the metallic housing is provided with a cutout so that plug components of the plug-connector section can at least partially pass to the outside. However, this very cutout ultimately reduces the shielding of the electromagnetic radiation and thus also the electromagnetic compatibility of the device.

SUMMARY OF THE INVENTION

It is therefore an object of the present invention to provide a device such as, for example, a control unit that exhibits improved electromagnetic compatibility.

The object is achieved by a device as claimed in the independent patent claim. Further configurations are the subject matter of the dependent claims.

The device according to the invention has a housing with an electrically conductive housing top part and an electrically conductive housing bottom part, which together form an accommodation chamber of the housing. The device furthermore has a circuit board (generally circuit-board module), arranged in the accommodation chamber, with a top side and with a bottom side, wherein the bottom side is connected electrically to the top side via electrically conductive bores. Such bores are for example electrical through-contacts, which are also referred to as vias. The circuit board furthermore has electromechanical plug components which make possible an electrical connection to electrical components outside the housing. Electromechanical plug components are for example plug and/or socket elements, plug pins and other elements required for forming an electrical contact with electrical components outside the housing. The circuit board furthermore has electrical or electronic circuit components. The electrical or electronic circuit components are all those components on the circuit board which are specifically not the electromechanical plug components. Electrical or electronic circuit components are for example SMD capacitors, MOSFETs, CPUs, processors, etc. In particular, within the scope of the present disclosure, electronic circuit components are elements which pass on high-frequency signals. Within the scope of the present disclosure, electrical or electronic circuit components are specifically not power-electronics elements, in particular not power-electronics components such as inverters or other elements related thereto or required therefor, as are used in the area of electric or hybrid vehicles for example for switching from DC voltage of a battery to AC voltage for an electric motor. The device as mentioned furthermore has a first electrically conductive separating wall, which electrically connects the housing top part to the top side of the circuit board. The device according to the invention furthermore has a second electrically conductive separating wall, which electrically connects the housing bottom part to the bottom side of the circuit board. Here, the first separating wall and the second separating wall extend substantially in a common plane. The term "substantially" is intended to express that the first and second separating walls extend within a common plane within narrow tolerance limits, which arise for example on account of the manufacture and/or production of the housing or of the separating walls. Here, the two separating walls are arranged in such a way that they subdivide the accommodation chamber of the housing into a first accommodation-chamber section on a first side of the two separating walls and into a second accommodation-chamber section on a second side, opposite the first side, of the two separating walls. In other words, the separating walls separate the accommodation chamber of the housing into two separate accommodation-chamber sections. In the device according to the invention, it is then the case that the circuit components are arranged on the circuit board in such a way that the circuit components are accommodated only in the first accommodation-chamber section. The plug components, by contrast, are arranged on the circuit board in such a way that the plug components are accommodated only in the second accommodation-chamber section.

The device according to the invention is based at least partially on the realization that, by means of two electrically conductive separating walls that electrically contact the circuit board from above and below and in this way subdivide the accommodation chamber of the housing into two separate accommodation-chamber sections, effectively two separate Faraday cages are formed. The fact, moreover, that, in the first accommodation-chamber section or in the first Faraday cage, there are arranged only the electrical or electronic circuit components, that is to say there are arranged those circuit components which generate electromagnetic radiation waves, and the fact that, in the second accommodation-chamber section or in the second Faraday cage, there are arranged only the electromechanical plug components, that is to say those components which can produce an electrical connection to the outside, means that transmission of the electromagnetic radiation waves generated in the first accommodation-chamber section into the second accommodation-chamber section is substantially damped. In other words, the electromagnetic radiation waves in the first accommodation-chamber section are, as it were, enclosed, whereby transmission of the electromagnetic radiation waves from the first accommodation-chamber section into the second accommodation-chamber section and from there into the surroundings is avoided. In this way, a device which exhibits improved electromagnetic compatibility is provided. The device according to the invention may be used for example as a control device, in particular in the area of area of automotive engineering. This is because, specifically in the area of automotive engineering, there are strict requirements with regard to electromagnetic compatibility.

In a preferred configuration of the device according to the invention, the electrical connection between the first separating wall and the top side of the circuit board and/or between the second separating wall and the bottom side of the circuit board are/is formed sectionally. The preferred configuration is based at least partially on the realization that, through a sectional formation of the electrical connection, production-related or manufacture-related non-planarities, in particular of the end sides of the first and/or the second separating wall, can be compensated better. This ensures reliable electrical contacting of the separating walls with the top or bottom side of the circuit board even for tolerance-affected components.

In one refinement of the preferred configuration, the electrical connection between the first separating wall and the top side of the circuit board and/or between the second separating wall and the bottom side of the circuit board are/is formed by means of solder points. This refinement is first based partially on the realization that solder points have a diameter of only a few millimeters (or even less), so that the "sectional" electrical contacting between the separating walls and the circuit board is reduced to increasingly smaller sections. In this way, on the one hand, existing tolerances or non-planarities can be compensated even better. On the other hand, solder points can be applied to the circuit board in a simple manner in terms of production, for example by means of screen printing, and so solder points also offer a cost advantage.

It is particularly advantageous if the solder points on the top side of the circuit board are arranged offset from the solder points on the bottom side of the circuit board. Here, use has been made of the realization that, during the assembly of housing top part and housing bottom part and thus the electrical contacting between separating walls and circuit board, in particular in the case of solder points arranged in an offset manner, a certain bracing and thus a certain elastic deformation of the circuit board is generated. This elastic deformation of the circuit board produced during the assembly of the device leads to a restoring force or spring force of the circuit board that counteracts the externally applied deformation of the circuit board, in particular in the region of the solder points arranged in an offset manner. In this way, the circuit board "presses", as it were, against the separating walls, whereby even better electrical contacting is ensured.

In a further preferred configuration of the device according to the invention, a distance between adjacent solder points, measured in a main extent plane of the circuit board, is selected on the basis of a wavelength of a (dominant) electromagnetic radiation wave formed in the first accommodation-chamber section. This configuration makes use of the realization that a dominating or dominant electromagnetic radiation wave with an associated frequency or wavelength can form in the first accommodation-chamber section, for example during operation of the electrical or electronic circuit components. On the basis of this, a distance between adjacent solder points, measured in the main extent plane of the circuit board and in the direction of the end side of the first or second separating wall, is then selected in such a way that transmission of this radiation wave into the second accommodation-chamber section is effectively damped. For example, the distance between adjacent solder points may be selected in such a way that the distance is matched to a wavelength associated with said radiation wave, for example is an integer multiple of the wavelength, etc. With this configuration, it is possible in particular for undesired electromagnetic radiation waves or radiation frequencies or frequency bands of electromagnetic radiation waves to be effectively damped. Ultimately, a distance between adjacent solder points that is matched to the respective requirements and is expediently selected makes it possible to set a kind of "radiation filter" which, in a targeted manner, prevents one or more electromagnetic radiation waves from transmitting from the first accommodation-chamber section into the second accommodation-chamber section.

In a further preferred configuration of the device according to the invention, the electrically conductive bores in the circuit board are arranged substantially in the common plane in which the first and second separating walls extend. Here, too, the term "substantially" is used in relation to the arrangement of the electrically conductive bores—like the two separating walls—in a common plane with narrow tolerances. The electrically conductive bores may again be provided as electrical through-contacts in the form of vias. This configuration makes use of the realization that a spatial and local proximity between the electrical connection of separating walls and circuit board, on the one hand, and top side and bottom side of the circuit plate, on the other hand, leads to better shielding/separation of the two Faraday cages at the "transition" between first and second separating wall.

In a further preferred configuration of the device according to the invention, an edge region of the circuit board is arranged between the housing top part and the housing bottom part in the first accommodation-chamber section, that is to say in the region in which the electrical or electronic circuit components are arranged, and the edge region is connected electrically to the housing top part and the housing bottom part. In this configuration, use is ultimately made of the realization that, by way of electrical through-contacting of the circuit board between the housing top part and the housing bottom part, the first accommodation-chamber section or the first Faraday cage can further be subdivided into two Faraday cages. In this way, there are effectively a Faraday cage above the circuit board and a Faraday cage below the circuit board. This further increases the electromagnetic compatibility of the device.

According to a further preferred configuration of the device according to the invention, the first separating wall is formed in one piece with the housing top part and the second separating wall is formed in one piece with the housing bottom part. This preferred configuration has advantages in particular in terms of production since it is consequently possible for the housing of the device to ultimately be of two-part form.

Other features which are considered as characteristic for the invention are set forth in the appended claims.

Although the invention is illustrated and described herein as embodied in a device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE FIGURES

FIG. 2 is a sectional view of an embodiment of the device according to the invention taken along the section line II-II shown in FIG. 1; and FIG. 3 is a sectional view of a further embodiment of the device according to the invention taken along the section line II-II shown in FIG. 1.

DETAILED DESCRIPTION OF THE INVENTION

Figure 1:
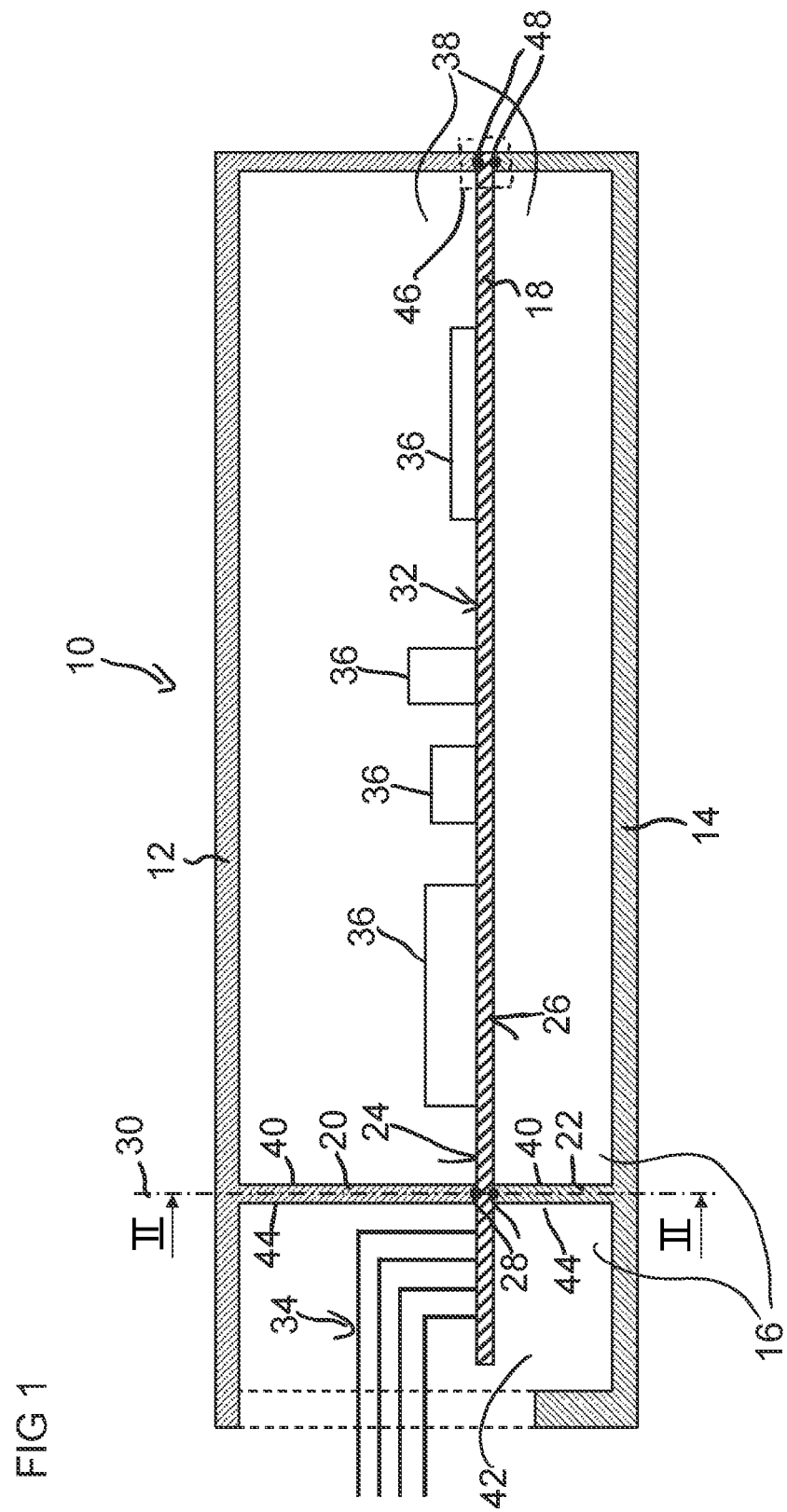
FIG. 1 is a schematic view of an embodiment of a device according to the invention.

Elements of the same design or function are denoted by the same reference signs throughout the figures.

Referring now to the figures of the drawings in detail and first, particularly to FIG. 1 thereof, there is shown a device 10. The device 10 may for example be a control device, such as for example a control unit.

The device 10 has an electrically conductive housing with an electrically conductive housing top part 12 and an electrically conductive housing bottom part 14. The housing top part 12, together with the housing bottom part 14, forms an accommodation chamber 16 of the housing. The device 10 furthermore has a circuit board or a circuit-board module 18, which is arranged in the accommodation chamber 16 of the housing.

The device 10 furthermore has a first separating wall 20, which is likewise electrically conductive and, in the specific example in FIG. 1, is formed in one piece with the housing top part 12. The device 10 furthermore has a second separating wall 22, which is likewise electrically conductive and, in the specific example in FIG. 1, is formed in one piece with the housing bottom part 14. In the context of the present disclosure, the expression "in one piece" means a material unit of first separating wall 20 with housing top part 12, on the one hand, and of second separating wall 22 with housing bottom part 14, on the other hand. Such a unit may be realized for example by casting, pressing or other methods of production known to a person skilled in the art of housing top part 12 or housing bottom part 14.

The first separating wall 20 produces an electrical contact with a top side 24 of the circuit board 18. The second separating wall 22 produces an electrical contact with a bottom side 26 of the circuit board 18. In the specific example in FIG. 1, the electrical contact is indicated schematically by a respective solder point 28 between an end side of the first separating wall 20 and the top side 24 of the circuit board 18, on the one hand, and an end side of the second separating wall 22 and the bottom side 26 of the circuit board 18, on the other hand. Consequently, the first separating wall 20 produces an electrical connection between the housing top part 12 and the top side 24 of the circuit board 18, and the second separating wall 22 produces an electrical connection between the housing bottom part 14 and the bottom side 26 of the circuit board.

As will furthermore be described in connection with FIGS. 2 and 3, electrically conductive bores are situated in the circuit board 18. The electrically conductive bores electrically connect the top side 24 of the circuit board to the bottom side 26 thereof. Such electrically conductive bores are known for example as vias to a person skilled in the art.

As is shown further in FIG. 1, the two separating walls 20, 22 extend substantially in a common plane 30. Furthermore, the two separating walls 20, 22 are, or the common plane 30 is, arranged perpendicularly to a main extent plane 32 of the circuit board 18. The main extent plane 32 of the circuit board is in this case that plane of the circuit board 18 on which components are mounted.

As is shown in FIG. 1, the circuit board has electromechanical plug components 34, which are indicated schematically as pins in FIG. 1. The electromechanical plug components 34 make possible an electrical connection to electrical components outside the housing (not shown), this being indicated by a cutaway area or aperture in the housing parts 12, 14. The circuit board 18 furthermore has electrical or electronic circuit components 36, of which a small number are indicated schematically as rectangular boxes in FIG. 1. The electrical or electronic circuit components 36 are all the other components that are not the electromechanical plug components 34. For example, circuit components 36 are MOSFETs, capacitors, CPUs, processors, etc.

As can be seen clearly in FIG. 1, the two separating walls 20, 22 subdivide the accommodation chamber 16 into two adjacent accommodation-chamber sections. In this way, a first accommodation-chamber section 38 is situated on a first side 40 of the first and second separating walls 20, 22. A second accommodation-chamber section 42 is situated on a second side 44, opposite the first side 40, of the first and second separating walls 20, 22.

As is furthermore shown in FIG. 1, the circuit components 36 are arranged on the circuit board 18 in such a way that the circuit components 36 are accommodated only in the first accommodation-chamber section 38. The electromechanical plug components 34, by contrast, are arranged on the circuit board 18 in such a way that the plug components 34 are accommodated only in the second accommodation-chamber section 42.

As can be seen in particular at the right-hand edge in FIG. 1, an edge region 46 (indicated schematically by a box) of the circuit board 18 is arranged between the housing top part 12 and the housing bottom part 14. Moreover, the edge region 46 is connected electrically to the housing top part 12 and the housing bottom part 14. In the specific example in FIG. 1, this electrical connection is again provided by means of solder points 48. Moreover, in the edge region 46 of the circuit board 18, there is electrical through-contacting, for example again by means of vias, such that the top side 24 of the circuit board 18 is connected electrically to the bottom side 26 thereof.

The first accommodation-chamber section 38 consequently forms a first Faraday cage in which exclusively the electrical or electronic circuit components 36 are arranged. The second accommodation-chamber section 42, by contrast, forms a second Faraday cage in which exclusively the electromechanical plug components 34 are arranged. Owing to the electrical through-contacts in the edge region 46 of the first accommodation-chamber section 38, the first Faraday cage is moreover effectively subdivided into two further Faraday cages, wherein one is arranged above the circuit board 18 and one is arranged below the circuit board 18.

The fact that two Faraday cages are ultimately present on opposite sides (or on the left and on the right) of the separating walls 20, 22 means that transmission of electromagnetic radiation waves, which are generated for example through the operation of the circuit components 36, from the first accommodation-chamber section 38 into the second accommodation-chamber section 42 can be effectively damped. In particular, passing-on or transmission of the electromagnetic radiation waves through the device 10 by way of the electromechanical plug components 34 can be damped or prevented.

Reference is now made to FIG. 2, which shows a schematic sectional view along the section line II-II shown in FIG. 1. For ease of illustration, the components 12, 14, 34 and 36 are not illustrated in FIG. 2.

As is shown in FIG. 2, on the top side 24 and the bottom side 26 of the circuit board 18, there are situated multiple solder points 28, of which by way of example 4 are denoted by the reference sign 28 in FIG. 2. The solder points 28 are arranged along the end side of the separating walls 20, 22, that is to say ultimately through the plane of the drawing in FIG. 1. The solder points 28 produce a sectionally electrical contact between the first separating wall 20 and the top side 24 of the circuit board 18, on the one hand, and between the second separating wall 22 and the bottom side 26 of the circuit board 18, on the other hand. The solder points 28 may be applied to the top side 24 and/or the bottom side 26 of the circuit board 18 for example by way of screen printing, which is known to a person skilled in the art. A distance 50 between two directly adjacent solder points 28, measured in a direction of the main extent plane 32 of the circuit board 18, is selected in a manner dependent on a wavelength of an electromagnetic radiation wave formed in the first accommodation-chamber section 38. Through the selection of the corresponding distance 50, transmission into the second accommodation-chamber section 42 of individual frequencies or frequency bands of electromagnetic radiation formed in the first accommodation-chamber section 38 can be effectively damped.

Furthermore, FIG. 2 schematically shows the electrically conductive bores 52 already mentioned in connection with FIG. 1. As already mentioned, the electrically conductive bores 52 serve for electrically connecting the top side 24 of the circuit board 18 to the bottom side 26 of the circuit board 18. In the specific example in FIG. 2, the electrically conductive bores 52 are arranged, in a direction of the main extent plane 32, between adjacent solder points 28. The electrically conductive bores 52 are moreover arranged substantially in a common plane 30, in which the two separating walls 20, 22 also extend. In other embodiments (not shown), it goes without saying that the electrically conductive bores 52 may also be arranged in other expedient arrangements.

Reference is now made to FIG. 3, which shows a schematic sectional view along the section line II-II shown in FIG. 1 of a further embodiment. For ease of illustration, the components 12, 14, 34 and 36 are again not illustrated in FIG. 3.

Compared with the embodiment in FIG. 2, in the embodiment in FIG. 3, the solder points 28 on the top side 24 of the circuit board 18 are arranged offset from the solder points 28 on the bottom side 26 thereof. This leads to the already mentioned bracing of the circuit board 18 during the assembly of the device 10.

In the embodiment in FIG. 3 too, a distance 54 between directly adjacent solder points 28, measured in the main extent plane 32 of the circuit board 18, may again be selected on the basis of a wavelength of an electromagnetic radiation wave formed in the first accommodation-chamber section 38.

Moreover, in the specific example in FIG. 3, the electrically conductive bores 52 are again arranged between adjacent solder points 28, although in other embodiments (not shown), it goes without saying that they may be arranged in other expedient arrangements.

The invention claimed is:

1. A device, comprising:
   a housing with an electrically conductive housing top part and an electrically conductive housing bottom part, which together form an accommodation chamber of said housing;
   a circuit board disposed in said accommodation chamber and having a top side and a bottom side, said bottom side is connected electrically to said top side via electrically conductive bores formed in said circuit board, wherein said circuit board further having electromechanical plug components which make possible an electrical connection to electrical components outside said housing, said circuit board additionally having electrical or electronic circuit components;
   a first electrically conductive separating wall electrically connecting said electrically conductive housing top part to said top side of said circuit board; and
   a second electrically conductive separating wall electrically connecting said electrically conductive housing bottom part to said bottom side of said circuit board, wherein said first electrically conductive separating wall and said second electrically conductive separating wall extend substantially in a common plane and subdivide said accommodation chamber of said housing into a first accommodation-chamber section on a first side of said first and second electrically conductive separating walls and into a second accommodation-chamber section on a second side, opposite said first side, of said first and second electrically conductive separating walls, and wherein said electrical or electronic circuit components are disposed on said circuit board such that said electrical or electronic circuit components are accommodated only in said first accommodation-chamber section, and said electromechanical plug components are disposed on said circuit board such that said electromechanical plug components are accommodated only in said second accommodation-chamber section;
   an electrical connection formed by solder points between said first electrically conductive separating wall and said top side of said circuit board and/or an electrical connection formed by solder points between said second electrically conductive separating wall and said bottom side of said circuit board; and
   said solder points being formed outside of, and spaced apart from, said electrically conductive bores formed in said circuit board.

2. The device according to claim 1, wherein a distance between adjacent ones of said solder points, measured in a main extent plane of said circuit board, is selected on a basis of a wavelength of an electromagnetic radiation wave formed in said first accommodation-chamber section.

3. The device according to claim 1, wherein said electrically conductive bores are disposed in a common plane in which said first and second electrically conductive separating walls extend.

4. The device according to claim 1, wherein said circuit board has an edge region disposed between said electrically conductive housing top part and said electrically conductive housing bottom part in said first accommodation-chamber section and said edge region is connected electrically to said electrically conductive housing top part and said electrically conductive housing bottom part.

5. The device according to claim 1, wherein said first electrically conductive separating wall is formed in one piece with said electrically conductive housing top part and said second electrically conductive separating wall is formed in one piece with said electrically conductive housing bottom part.

6. A device, comprising:
- a housing with an electrically conductive housing top part and an electrically conductive housing bottom part, which together form an accommodation chamber of said housing;
- a circuit board disposed in said accommodation chamber and having a top side and a bottom side, said bottom side is connected electrically to said top side via electrically conductive bores formed in said circuit board, wherein said circuit board further having electromechanical plug components which make possible an electrical connection to electrical components outside said housing, said circuit board additionally having electrical or electronic circuit components;
- a first electrically conductive separating wall electrically connecting said electrically conductive housing top part to said top side of said circuit board;
- a second electrically conductive separating wall electrically connecting said electrically conductive housing bottom part to said bottom side of said circuit board, wherein said first electrically conductive separating wall and said second electrically conductive separating wall extend substantially in a common plane and subdivide said accommodation chamber of said housing into a first accommodation-chamber section on a first side of said first and second electrically conductive separating walls and into a second accommodation-chamber section on a second side, opposite said first side, of said first and second electrically conductive separating walls, and wherein said electrical or electronic circuit components are disposed on said circuit board such that said electrical or electronic circuit components are accommodated only in said first accommodation-chamber section, and said electromechanical plug components are disposed on said circuit board such that said electromechanical plug components are accommodated only in said second accommodation-chamber section;
- an electrical connection between said first electrically conductive separating wall and said top side of said circuit board and/or an electrical connection between said second electrically conductive separating wall and said bottom side of said circuit board are/is formed sectionally;
- said electrical connection between said first electrically conductive separating wall and said top side of said circuit board and/or said electrical connection between said second electrically conductive separating wall and said bottom side of said circuit board are/is formed by means of solder points; and
- wherein said solder points on said top side of said circuit board are disposed offset from said solder points on said bottom side of said circuit board.

* * * * *